(12) United States Patent
Wu et al.

(10) Patent No.: US 10,276,650 B2
(45) Date of Patent: Apr. 30, 2019

(54) SEMICONDUCTOR MEMORY DEVICE AND MANUFACTURING METHOD THEREOF (71) Applicants: UNITED MICROELECTRONICS CORP., Hsin-Chu (TW); Fujian Jinhua Integrated Circuit Co., Ltd., Quanzhou, Fujian Province (CN)

(72) Inventors: Tzu-Chin Wu, Chiayi County (TW); Wei-Hsin Liu, Changhua County (TW); Yi-Wei Chen, Taichung (TW); Chia-Lung Chang, Tainan (TW); Jui-Min Lee, Taichung (TW); Po-Chun Chen, Tainan (TW); Li-Wei Feng, Kaohsiung (TW); Ying-Chiao Wang, Changhua County (TW); Wen-Chieh Lu, Taoyuan (TW); Chien-Ting Ho, Taichung (TW); Tsung-Ying Tsai, Kaohsiung (TW); Kai-Ping Chen, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/927,103

(22) Filed: Mar. 21, 2018

(65) Prior Publication Data

US 2018/0308923 A1  Oct. 25, 2018

(30) Foreign Application Priority Data

Apr. 21, 2017 (CN) .......................... 2017 1 0264658

(51) Int. Cl.
H01L 27/108 (2006.01)
H01L 49/02 (2006.01)
H01L 29/94 (2006.01)

(52) U.S. Cl.
CPC ........ *H01L 28/82* (2013.01); *H01L 27/10808* (2013.01); *H01L 27/10855* (2013.01); *H01L 28/87* (2013.01); *H01L 29/94* (2013.01)

(58) Field of Classification Search
CPC ... H01L 28/90; H01L 28/91; H01L 29/66181; H01L 29/945
See application file for complete search history.

(56) References Cited

U.S. PATENT DOCUMENTS

8,816,418 B2  8/2014  Kim
8,941,164 B2  1/2015  Cho
(Continued)

*Primary Examiner* — Hsien Ming Lee
(74) *Attorney, Agent, or Firm* — Winston Hsu (57) ABSTRACT

A semiconductor memory device includes a semiconductor substrate, a first support layer, a first electrode, a capacitor dielectric layer, and a second electrode. The first support layer is disposed on the semiconductor substrate. The first electrode is disposed on the semiconductor substrate and penetrates the first support layer. The capacitor dielectric layer is disposed on the first electrode. The second electrode is disposed on the semiconductor substrate, and at least a part of the capacitor dielectric layer is disposed between the first electrode and the second electrode. The first support layer includes a carbon doped nitride layer, and a carbon concentration of a bottom portion of the first support layer is higher than a carbon concentration of a top portion of the first support layer.

10 Claims, 7 Drawing Sheets

(56) References Cited

U.S. PATENT DOCUMENTS

| | | |
|---|---|---|
| 8,969,167 B2 | 3/2015 | Yoon |
| 9,159,729 B2 | 10/2015 | Kim |
| 2006/0086952 A1 | 4/2006 | Kim |
| 2009/0315143 A1 | 12/2009 | Jung |
| 2013/0228837 A1* | 9/2013 | Sukekawa ........... H01L 27/0629 257/296 |

* cited by examiner

SEMICONDUCTOR MEMORY DEVICE AND MANUFACTURING METHOD THEREOF

BACKGROUND OF THE INVENTION

1. Field of the Invention

The present invention relates to a semiconductor memory device and a manufacturing method thereof, and more particularly, to a semiconductor memory device including a capacitor structure and a manufacturing method thereof.

2. Description of the Prior Art

Dynamic random access memory (DRAM) is a kind of volatile storage device which is an indispensable key part of many electronic products. DRAM includes a great number of memory cells arranged for forming an array configured to store data. Each of the memory cells may be composed of a metal oxide semiconductor (MOS) transistor and a capacitor connected in series.

The density of the memory cell has to be increased for the product demands, and the difficulty and the complexity of the related processes and design become higher accordingly. For instance, the area occupied by the capacitor structure in the memory cell becomes smaller relatively when the density of the memory cell increases. The capacitor structure has to extend upwards for increasing the area of the electrode in the capacitor structure because of the demand for a specific capacitance. However, it is very difficult to form an electrode layer having an extremely high aspect ratio when the height of the capacitor structure increases, and the manufacturing yield cannot be improved accordingly.

SUMMARY OF THE INVENTION

A semiconductor memory device and a manufacturing method thereof are provided in the present invention. Etching damage of a first support layer in an etching process for removing an oxide layer may be mitigated by forming the first support layer having a distribution of different compositions and/or different etching rates. The purpose of enhancing the manufacturing yield may be achieved accordingly.

A semiconductor memory device is provided in an embodiment of the present invention. The semiconductor memory device includes a semiconductor substrate, a first support layer, a first electrode, a capacitor dielectric layer, and a second electrode. The first support layer is disposed on the semiconductor substrate. The first electrode is disposed on the semiconductor substrate and penetrates the first support layer. The capacitor dielectric layer is disposed on the first electrode, and the second electrode is disposed on the semiconductor substrate. At least a part of the capacitor dielectric layer is disposed between the first electrode and the second electrode. The first support layer includes a carbon doped nitride layer, and a carbon concentration of a bottom portion of the first support layer is higher than a carbon concentration of a top portion of the first support layer.

A manufacturing method of a semiconductor memory device is provided in an embodiment of the present invention. The manufacturing method includes the following steps. A semiconductor substrate is provided first. A first oxide layer and a first support layer are formed on the semiconductor substrate sequentially. A first etching process is performed for patterning the first oxide layer and the first support layer. A first electrode is formed on the semiconductor substrate after the first etching process. The first electrode penetrates the first support layer and the first oxide layer. A second etching process is performed for removing the first oxide layer after the step of forming the first electrode. An etching rate of a bottom portion of the first support layer in the second etching process is lower than an etching rate of a top portion of the first support layer in the second etching process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic drawings illustrating a manufacturing method of a semiconductor memory device according to a first embodiment of the present invention, wherein

DETAILED DESCRIPTION

Figure 1:
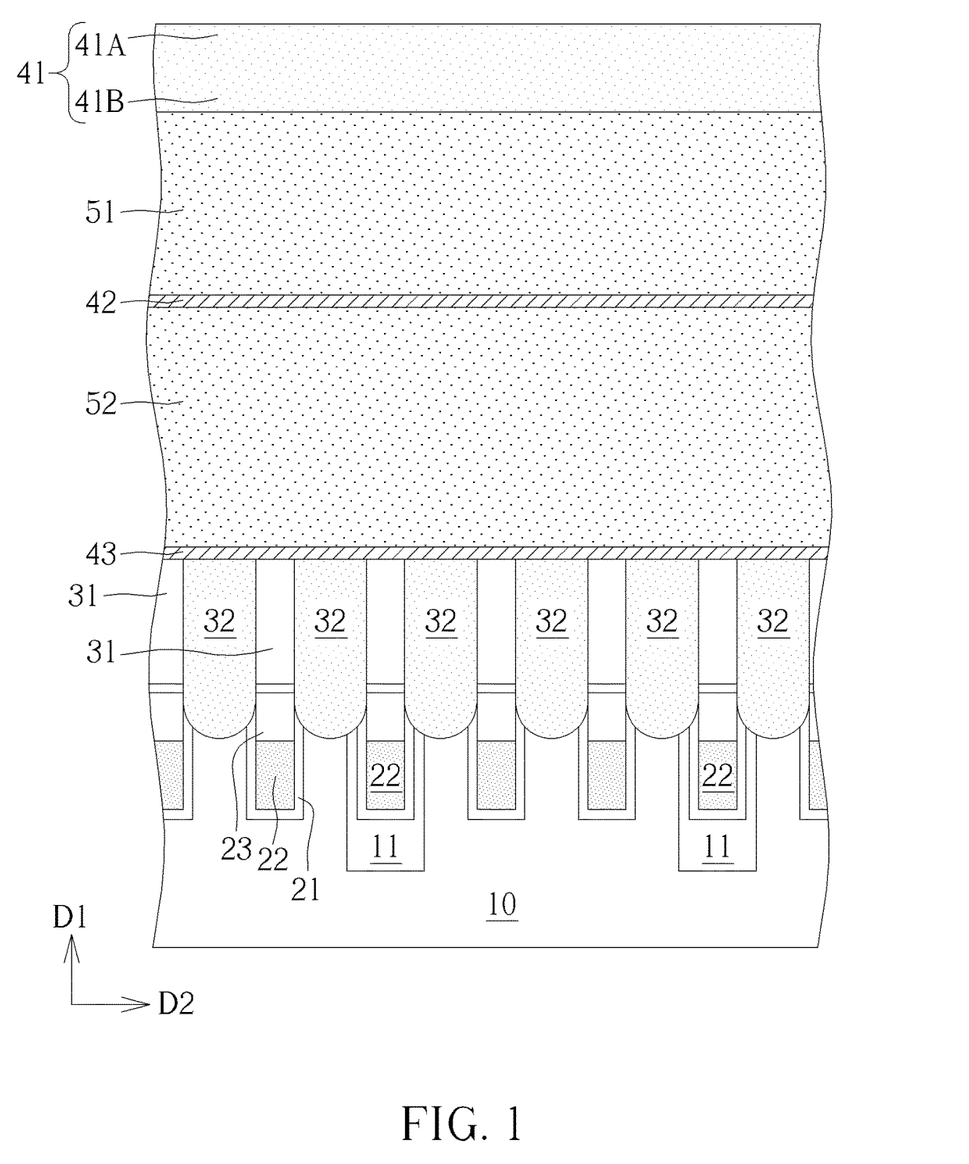

Please refer to FIGS. 1-6. FIGS. 1-6 are schematic drawings illustrating a manufacturing method of a semiconductor memory device according to a first embodiment of the present invention. The manufacturing method of the semiconductor memory device may include but is not limited to the following steps. Firstly, as shown in FIG. 1, a semiconductor substrate 10 is provided. The semiconductor substrate 10 may include a silicon substrate, an epitaxial silicon substrate, a silicon germanium substrate, a silicon carbide substrate, or a silicon-on-insulator (SOI) substrate, but not limited thereto. In this embodiment, a shallow trench isolation 11 may be formed in the semiconductor substrate 10 for defining a plurality of active areas in the semiconductor substrate 10. Additionally, a plurality of word lines 22 may be formed in the semiconductor substrate 10, and the word lines 22 in this embodiment may be buried word lines, but not limited thereto. The word lines 22 may be formed and buried in the semiconductor substrate 10. A word line dielectric layer 21 may be formed between each of the word lines 22 and the semiconductor substrate 10, and a word line cap layer 23 may be formed on each of the word lines 22 and cover the word line 22. The word line dielectric layers 21, the word lines 22, and the word line cap layers 23 may be formed by forming a plurality of trenches in the semiconductor substrate 10, and the word line dielectric layers 21, the word lines 22, and the word line cap layers 23 may be sequentially formed in the trenches, but not limited thereto. In some embodiments, the word line dielectric layer 21 may include silicon oxide or other suitable dielectric materials, the word line 22 may include aluminum (Al), tungsten (W), copper (Cu), titanium aluminide (TiAl), or other suitable conductive materials, and the word line cap layer 23 may include silicon nitride, silicon oxynitride, silicon carbonitride, or other suitable insulation materials.

Subsequently, a plurality of bit line structures (not shown) and a plurality of storage node contact 32 may be formed on the semiconductor substrate 10. The storage node contact 32 is formed corresponding to and electrically connected with at least one of the active areas. The storage node contacts 32 may be formed by forming an isolation structure 31 including a plurality of openings on the semiconductor substrate 10, filling the openings of the isolation structure 31 with a conductive material, and performing an etching back process to the conductive material, but not limited thereto. The storage node contacts 32 may include a conductive material containing silicon, such as amorphous silicon, polysilicon and/or other conductive materials such as metal conductive materials. For example, a lower part of the storage node contact 32 may be a conductive material containing silicon, and an upper part of the storage node contact 32 may be a metal conductive material with relatively lower resistivity, such as tungsten, but not limited thereto. In addition, a metal silicide layer may be formed between the lower part and the upper part of each storage node contact 32 for lowering a contact resistance between the conductive material containing silicon and the metal conductive material, but not limited thereto.

Subsequently, a first oxide layer 51 and a first support layer 41 are formed on the semiconductor substrate 10 sequentially. The first support layer 41 may include a bottom portion 41B connected with the first oxide layer 51 and a top portion 41A disposed above the bottom portion 41B. Additionally, in some embodiments, a third support layer 43, a second oxide layer 52, and a second support layer 42 may be formed sequentially on the semiconductor substrate 10 before the steps of forming the first oxide layer 51 and the first support layer 41. The first oxide layer 51 is located between the first support layer 41 and the second support layer 42 in a first direction D1 which is a vertical direction. The second oxide layer 42 is located between the second support layer 42 and the semiconductor substrate 10 in the first direction D1. The third support layer 43 is located between the second oxide layer 52 and the semiconductor substrate 10 in the first direction D1. The thickness of the first support layer 41 is larger than the thickness of the second support layer 42 and the thickness of the third support layer 43 preferably for avoiding the thicker second support layer 42 and the thicker third support layer 43 from influencing the area of the capacitor structure formed subsequently, and the support performance may be ensured by the relatively thicker first support layer 41. In some embodiments, the first oxide layer 51 and the first support layer 41 may be formed without forming the second oxide layer 52, the second support layer 42, and/or the third support layer 43 according to some considerations. In addition, the first oxide layer 51 and the second oxide layer 52 may include a single layer or a multiple layer structure of oxide materials such as silicon oxide, tetraethyl orthosilicate (TEOS), boro-phospho-silicate-glass (BPSG) respectively, and the first support layer 41, the second support layer 42, and the third support layer 43 may include a single layer or a multiple layer structure of materials such as nitride (e.g. silicon nitride), carbon doped nitride (e.g. carbon doped silicon nitride), carbide (e.g. silicon carbide), and oxide (e.g. tantalum oxide and titanium oxide), but not limited thereto.

Figure 2:
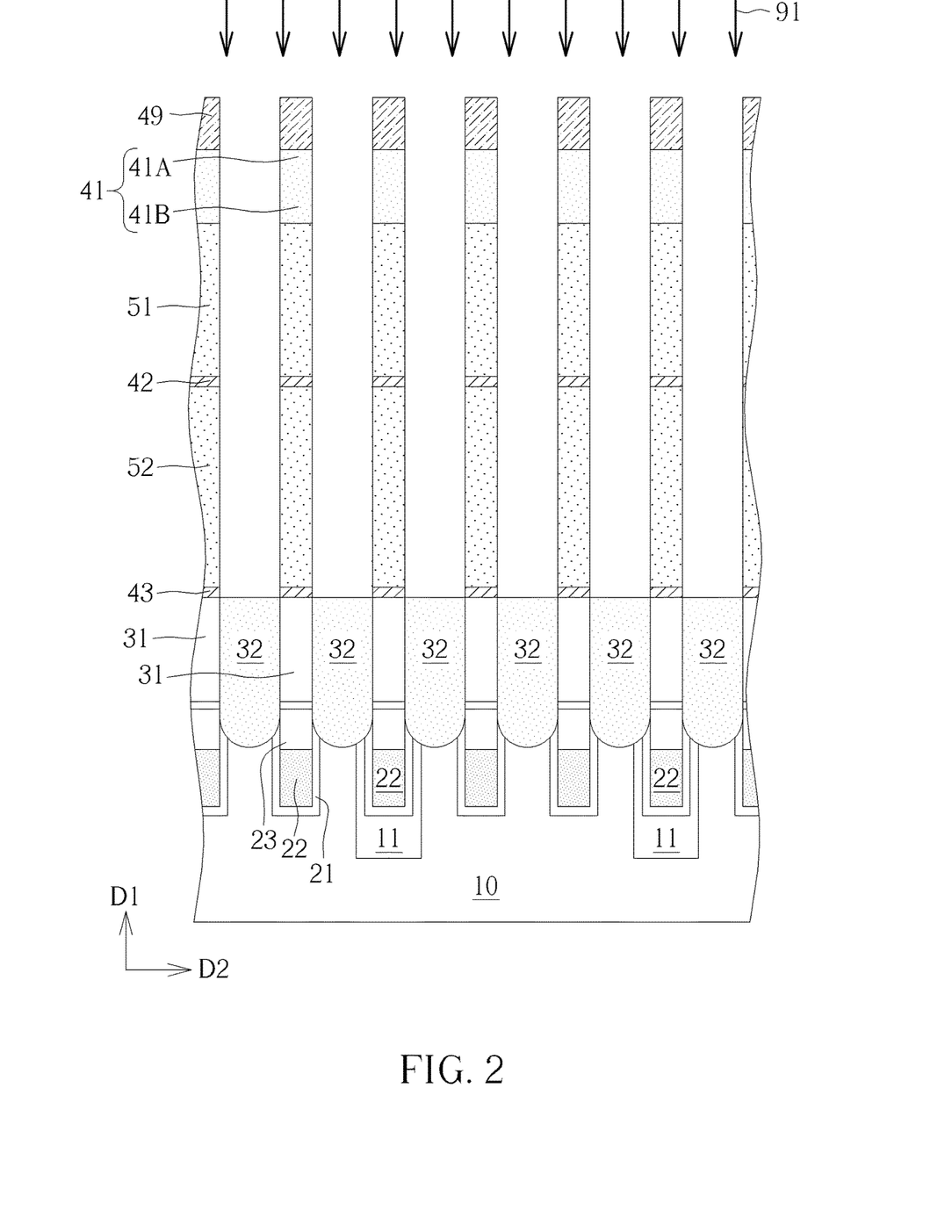
FIG. 2 is a schematic drawing in a step subsequent to FIG. 1.

As shown in FIG. 2, a first etching process 91 using a patterned mask layer 49 may be performed for patterning the first oxide layer 51 and the first support layer 41. When the second support layer 42, the second oxide layer 52, and the third support layer 43 are formed, the second support layer 42, the second oxide layer 52, and the third support layer 43 may also be patterned by the first etching process 91 for exposing at least a part of the storage node contacts 32.

Figure 3:
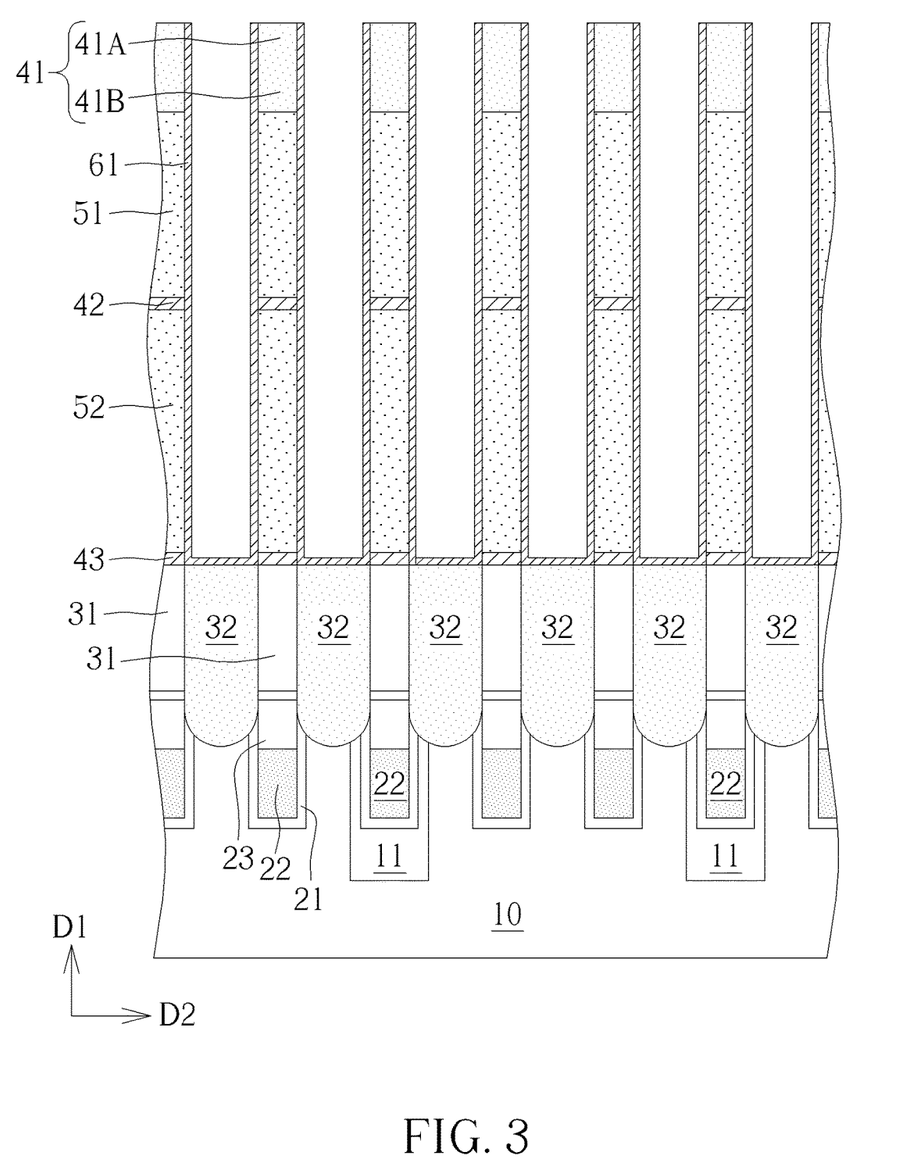
FIG. 3 is a schematic drawing in a step subsequent to FIG. 2.

As shown in FIG. 2 and FIG. 3, after the first etching process 91, the patterned mask layer 49 is removed, and a first electrode 61 is formed on the semiconductor substrate 10. The first electrode 61 penetrates the first support layer 41 and the first oxide layer 51. In some embodiments, the first electrode 61 may further penetrate the second support layer 42, the second oxide layer 52, and the third support layer 43, but not limited thereto. Additionally, the first electrode 61 is electrically connected with the corresponding storage node contact 32, and the first support layer 41, the second support layer 42, and the third support layer 43 are located at a side of the first electrode 61 in a vertical second direction D2. In some embodiments, the material of the first electrode 61 may include metal conductive materials such as metal nitride or other suitable conductive materials. The metal nitride mentioned above may include titanium nitride, tantalum nitride, and tungsten nitride, but not limited thereto.

Figure 4:
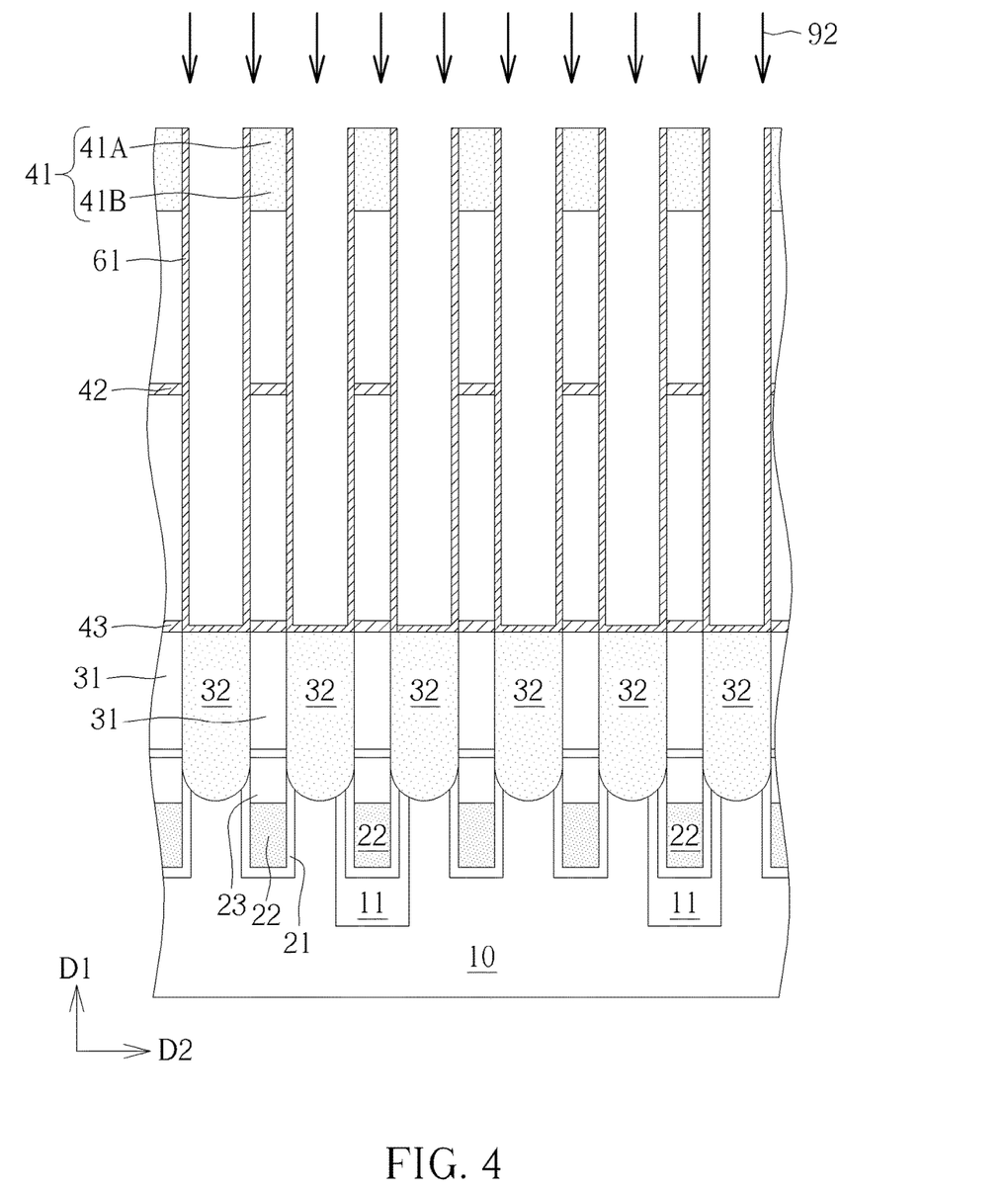
FIG. 4 is a schematic drawing in a step subsequent to FIG. 3.

As shown in FIG. 3 and FIG. 4, a second etching process 92 is performed for removing the first oxide layer 51 after the step of forming the first electrode 61. In some embodiments, the second etching process 92 may further remove the second oxide layer 52, but not limited thereto. It is worth noting that the first etching process described above may be an anisotropic etching process such as a dry etching process preferably, and the second etching process may be an isotropic etching process such as a wet etching process preferably, but not limited thereto. In some embodiments, the first etching process may be a single etching step configured to etch the first support layer 41, the first oxide layer 51, the second support layer 42, the second oxide layer 52, and the third support layer 43 continuously, or the first etching process may include etching steps with different process conditions for etching the first support layer 41, the first oxide layer 51, the second support layer 42, the second oxide layer 52, and the third support layer 43 respectively. For instance, when the first support layer 41, the second support layer 42, and the third support layer 43 are nitride layers, the first etching process may include a plasma etching configured to etch the first support layer 41, the second support layer 42, and the third support layer 43, and the process gas of the plasma etching may include oxygen, nitrogen, hydrogen, nitrogen trifluoride ($NF_3$), tetrafluoromethane ($CF_4$), sulfur hexafluoride ($SF_6$), and/or methane ($CH_4$), but not limited thereto. The composition ratio of the process gas described above may be adjusted to control the etching selectivity between different materials in the plasma etching. For example, in some embodiments, the etching rate of the first support layer 41, the second support layer 42, and the third support layer 43 in the plasma etching of the first etching process may be higher than the etching rate of the first oxide layer 51 and the second oxide layer 52 in the plasma etching of the first etching process, but not limited thereto. Additionally, the etching step for etching the first oxide layer 51 and the second oxide layer 52 in the first etching process may have higher etching selectivity to the first oxide layer 51 and the second oxide layer 52 for controlling the etched patterned formed by the first etching process. In addition, an etching rate of the bottom portion 41B of the first support layer 41 in the second etching process 92 may be lower than an etching rate of the top portion 41A of the first support layer 41 in the second etching process 92 for enhancing the etch resistance of the side the first support layer 41 contacting the first oxide layer 51 in the second etching process 92 and ensuring that the supporting performance of the first support layer 41 is not influenced by the damage caused by the second etching process 92. In other words, the top portion 41A of the first support layer 41 and the bottom portion 41B of the first support layer 41 may be made of different materials or made by different composition ratio for realizing the etching rate difference in the second etching process 92. For example, when the first support layer 41 is a carbon doped nitride layer, a carbon concentration of the bottom portion 41B of the first support layer 41 may be higher than a carbon concentration of the top portion 41A of the first support layer 41 preferably because the etch resistance increases in the second etching process 92 as the concentration of the carbon dopant increases. For instance, the carbon concentration of the top portion 41A of the first support layer 41 may be around 6%, and the carbon concentration of the bottom portion 41B of the first support layer 41 may range from 10% to 15%. It is worth noting that the etching condition of the first support layer 41 in the first etching process described above is another factor in determining the composition ratio of the first support layer 41. Because the first etching process may be an anisotropic etching process, the etching rate of the top portion 41A of the first support layer 41 in the first etching process cannot be too high for avoiding the pattern and the structure of the first support layer 41 patterned by the first etching process from being out of control. When the first support layer 41 is a carbon doped nitride layer, the etching rate increases in the first etching process as the concentration of the carbon dopant increases. Therefore, the carbon concentration of the top portion 41A of the first support layer 41 has to be relatively lower, and an etching rate of the top portion 41A of the first support layer 41 in the first etching process will be lower than an etching rate of the bottom portion 41B of the first support layer 41 in the first etching process.

Additionally, in some embodiments, the carbon concentration of the first support layer 41 may be gradually increased from the top of the first support layer 41 to the bottom of the first support layer 41. For example, the carbon concentration of the first support layer 41 may be 6% at the top of the first support layer 41 and may be gradually increased to 10%~15% at the bottom of the first support layer 41, but not limited thereto. In some embodiments, the second support layer 42 may include a carbon doped nitride layer also, and a carbon concentration of the second support layer 42 may be higher than the carbon concentration of the top portion 41A of the first support layer 41 for enhancing the etch resistance of the second support layer 42 in the second etching process 92, but not limited thereto. In some embodiments, the third support layer 43 may include a carbon doped nitride layer also, and a carbon concentration of the third support layer 43 may be higher than the carbon concentration of the top portion 41A of the first support layer 41 for enhancing the etch resistance of the third support layer 43 in the second etching process 92, but not limited thereto. It is worth noting that the above mentioned condition may be referred when the first support layer 41, the second support layer 42, and the third support layer 43 are carbon doped nitride layers, but the present invention is not limited to this. In some embodiments, the first support layer 41, the second support layer 42, and/or the third support layer 43 may be formed by other materials, and the etching condition in the first etching process and the second etching process described above may be realized by modifying the materials and/or the composition ratio of the first support layer 41, the second support layer 42, and/or the third support layer 43.

Figure 5:
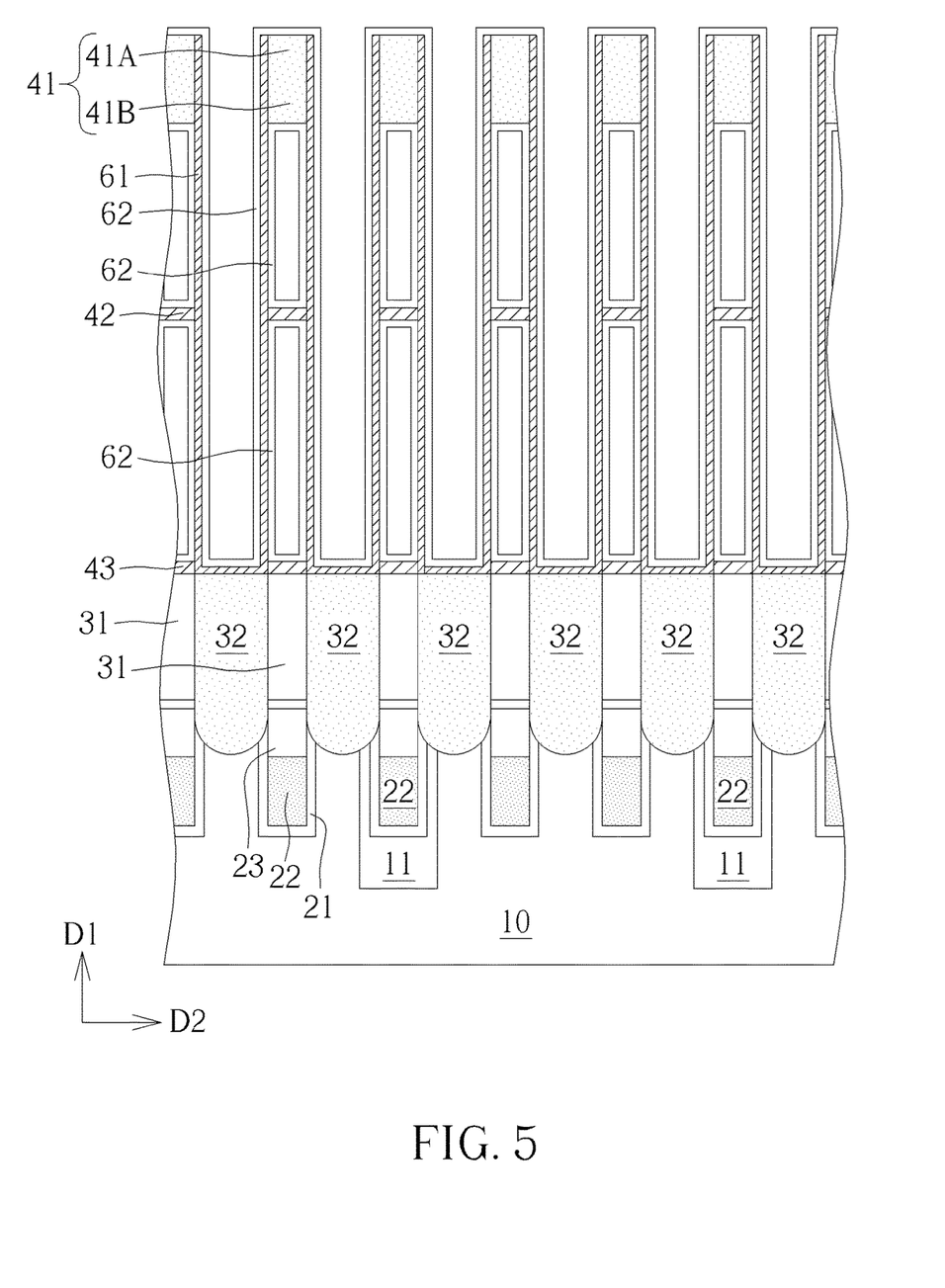
FIG. 5 is a schematic drawing in a step subsequent to FIG. 4.
Figure 6:
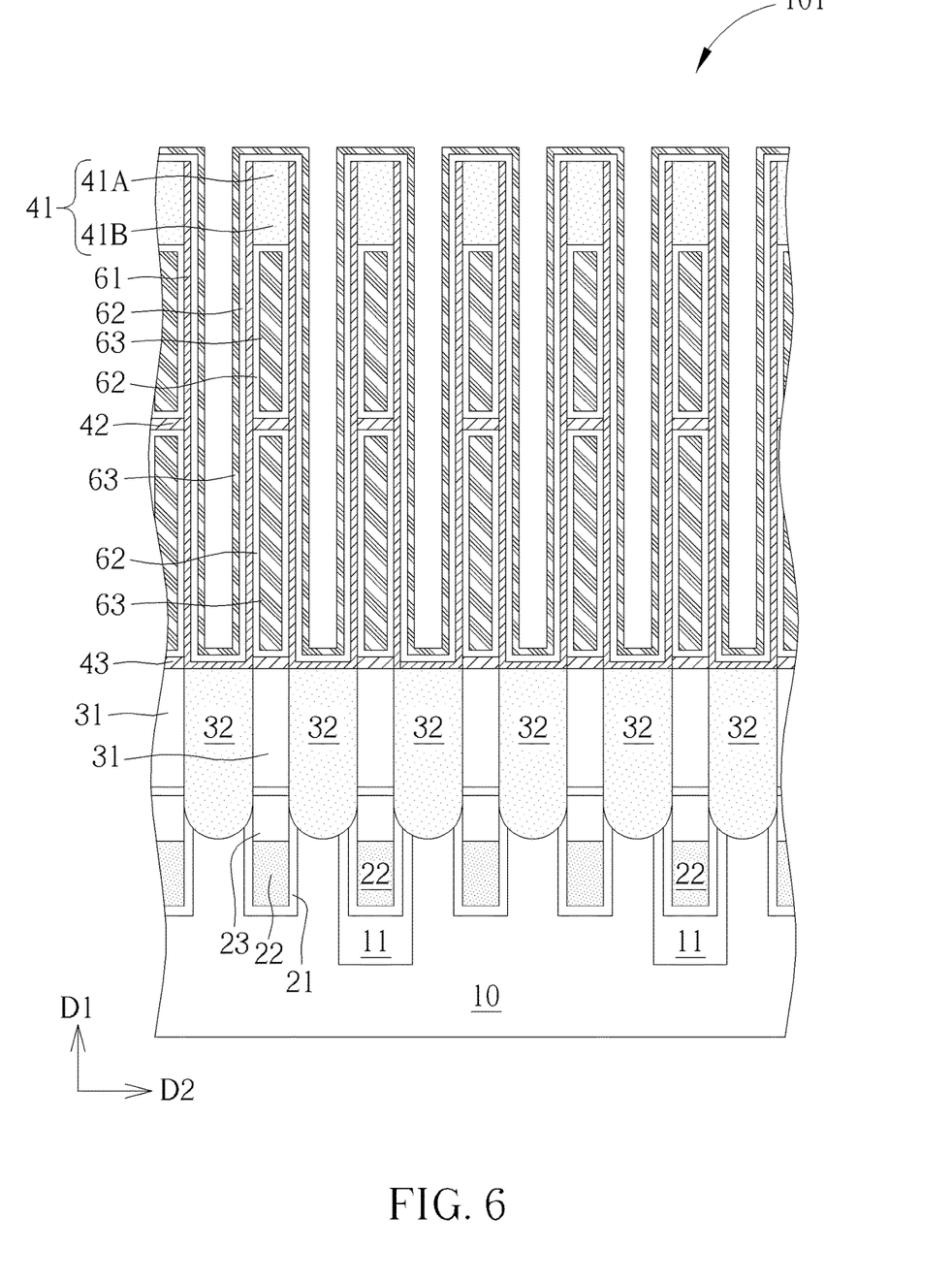
FIG. 6 is a schematic drawing in a step subsequent to FIG. 5.

As shown in FIGS. 4-6, after the second etching process 92, a capacitor dielectric layer 62 and a second electrode 63 are formed on the semiconductor substrate 10. At least a part of the capacitor dielectric layer 62 is located between the first electrode 61 and the second electrode 63 for forming a capacitor structure, and a part of the capacitor structure may be located on the storage node contact 32, located between the first support layer 41 and the second support layer 42, and located between the second support layer 42 and the third support layer 43, but not limited thereto. In some embodiments, the first electrode 61 and the second electrode 63 may be regarded as a bottom electrode and a top electrode of the capacitor structure mentioned above respectively, but not limited thereto. A semiconductor memory device 101 shown in FIG. 6 may be formed by the manufacturing method described above.

The semiconductor memory device 101 in this embodiment may include the semiconductor substrate 10, the first support layer 41, the first electrode 61, the capacitor dielectric layer 62, and the second electrode 63. The first support layer 41 is disposed on the semiconductor substrate 10. The first electrode 61 is disposed on the semiconductor substrate 10 and penetrates the first support layer 41. The capacitor dielectric layer 62 is disposed on the first electrode 61, and the second electrode 63 is disposed on the semiconductor substrate 10. At least a part of the capacitor dielectric layer 62 is disposed between the first electrode 61 and the second electrode 62. The first support layer 41 includes a carbon doped nitride layer, and the carbon concentration of the bottom portion 41B of the first support layer 41 is higher than the carbon concentration of the top portion 41A of the first support layer 41.

As shown in FIG. 6, in some embodiments, the semiconductor memory device 101 may further include the second support layer 42 and the third support layer 43. The second support layer 42 is disposed between the semiconductor substrate 10 and the first support layer 41, and the first electrode 61 further penetrates the second support layer 42. At least a part of the capacitor dielectric layer 62 and at least a part of the second electrode 63 may be disposed between the first support layer 41 and the second support layer 42, but not limited thereto. The third support layer 43 is disposed between the semiconductor substrate 10 and the second support layer 42, and the first electrode 61 further penetrates the third support layer 43. At least a part of the capacitor dielectric layer 62 and at least a part of the second electrode 63 may be disposed between the second support layer 42 and the third support layer 43, but not limited thereto. The semiconductor memory device 101 may further include at least one storage node contact 32 disposed on the semiconductor substrate 10. The first electrode 61 penetrates the first support layer 41, the second support layer 42, and the third support layer 43 for being electrically connected with the storage node contact 32.

In some embodiments, the thickness of the second support layer 42 and the thickness of the third support layer 43 may be smaller than the thickness of the first support layer 41 respectively for avoiding the area of the capacitor dielectric layer 62 and the second electrode 63 from being influenced by the second support layer 42 and the third support layer 43 which are too thick. Additionally, in some embodiments, the first support layer 41, the second support layer 42, and the third support layer 43 may be a carbon doped nitride layer respectively, and the carbon concentration of the second support layer 42 and the carbon concentration of the third support layer 43 may be higher than the carbon concentration of the top portion 41A of the first support layer 41 for enhancing the etch resistance of the second support layer 42 and the third support layer 43 in the second etching process described above, but not limited thereto.

Figure 7:
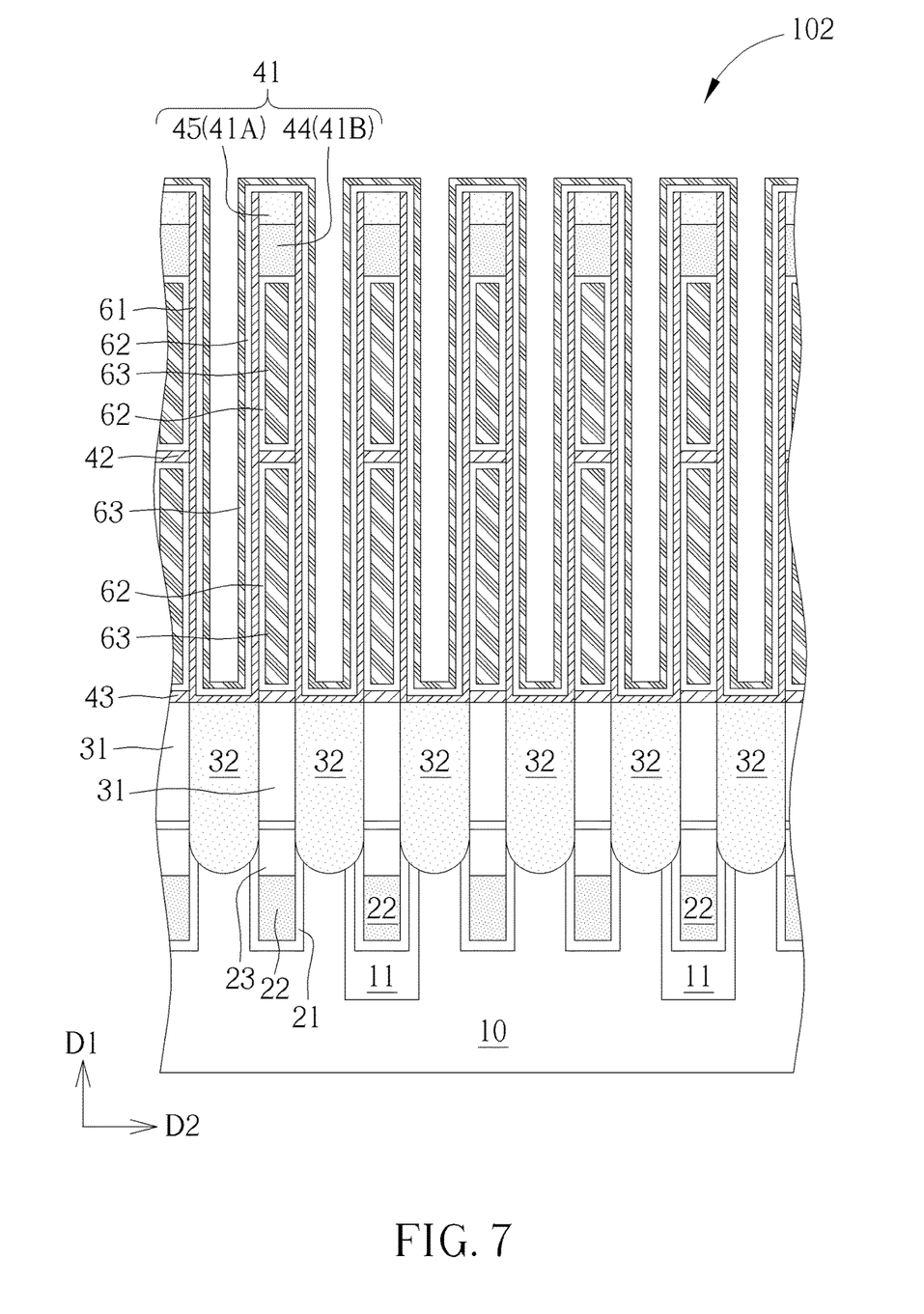
FIG. 7 is a schematic drawing illustrating a semiconductor memory device according to a second embodiment of the present invention.

Please refer to FIG. 7. FIG. 7 is a schematic drawing illustrating a semiconductor memory device 102 according to a second embodiment of the present invention. As shown in FIG. 7, the difference between the semiconductor memory device 102 and the semiconductor memory device in the first embodiment described above is that, in the semiconductor memory device 102, the first support layer 41 may include a first carbon doped nitride layer 44 and a second carbon doped nitride layer 45. The first carbon doped nitride layer 44 is disposed between the second carbon doped nitride layer 45 and the semiconductor substrate 10 in the first direction D1. A carbon concentration of the first carbon doped nitride layer 44 is higher than a carbon concentration of the second carbon doped nitride layer 45 for enhancing the etch resistance of the first support layer 41 in the second etching process described above. In other words, the first support layer 41 may include a stacked structure composed of two carbon doped nitride layers having different carbon concentrations. The first carbon doped nitride layer 44 and the second carbon doped nitride layer 45 may be formed by film forming steps with different process parameters.

To summarize the above descriptions, according to the semiconductor memory device and the manufacturing method thereof in the present invention, the first support layer having different carbon concentration distribution may be formed for enhancing the etch resistance of the first support layer in the second etching process configured to remove the oxide layer and ensuring the performance of the first support layer supporting the first electrode. The manufacturing yield of the semiconductor memory device may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a semiconductor substrate;
   a first support layer disposed on the semiconductor substrate;
   a first electrode disposed on the semiconductor substrate, wherein the first electrode penetrates the first support layer;
   a capacitor dielectric layer disposed on the first electrode;
   a second electrode disposed on the semiconductor substrate, wherein at least a part of the capacitor dielectric layer is disposed between the first electrode and the second electrode, wherein the first support layer comprises a carbon doped nitride layer, and a carbon concentration of a bottom portion of the first support layer is higher than a carbon concentration of a top portion of the first support layer; and
   a second support layer disposed between the semiconductor substrate and the first support layer, wherein the first electrode further penetrates the second support layer, and at least a part of the capacitor dielectric layer and at least a part of the second electrode are disposed between the first support layer and the second support layer, wherein the second support layer comprises a carbon doped nitride layer, and a carbon concentration of the second support layer is higher than the carbon concentration of the top portion of the first support layer.

2. The semiconductor memory device according to claim 1, wherein the carbon doped nitride layer comprises a carbon doped silicon nitride.

3. The semiconductor memory device according to claim 1, wherein the carbon concentration of the first support layer is gradually increased from the top of the first support layer to the bottom of the first support layer.

4. The semiconductor memory device according to claim 1, wherein the first support layer comprises a first carbon doped nitride layer and a second carbon doped nitride layer, the first carbon doped nitride layer is disposed between the second carbon doped nitride layer and the semiconductor substrate, and a carbon concentration of the first carbon doped nitride layer is higher than a carbon concentration of the second carbon doped nitride layer.

5. The semiconductor memory device according to claim 1, wherein a thickness of the second support layer is smaller than a thickness of the first support layer.

6. The semiconductor memory device according to claim 1, further comprising:
   a third support layer disposed between the semiconductor substrate and the second support layer, wherein the first electrode further penetrates the third support layer, and at least a part of the capacitor dielectric layer and at least a part of the second electrode are disposed between the second support layer and the third support layer.

7. The semiconductor memory device according to claim 6, wherein the third support layer comprises a carbon doped nitride layer, and a carbon concentration of third support layer is higher than the carbon concentration of the top portion of the first support layer.

8. The semiconductor memory device according to claim 6, wherein a thickness of the third support layer is smaller than a thickness of the first support layer.

9. The semiconductor memory device according to claim 1, further comprising:
   at least one storage node contact disposed on the semiconductor substrate, wherein the first electrode is electrically connected with the at least one storage node contact.

10. A semiconductor memory device, comprising:
    a semiconductor substrate;
    a first support layer disposed on the semiconductor substrate;
    a first electrode disposed on the semiconductor substrate, wherein the first electrode penetrates the first support layer;
    a capacitor dielectric layer disposed on the first electrode;
    a second electrode disposed on the semiconductor substrate, wherein at least a part of the capacitor dielectric layer is disposed between the first electrode and the second electrode, wherein the first support layer comprises a carbon doped nitride layer, and a carbon concentration of a bottom portion of the first support layer is higher than a carbon concentration of a top portion of the first support layer; and
    a second support layer disposed between the semiconductor substrate and the first support layer, wherein the first electrode further penetrates the second support layer, and at least a part of the capacitor dielectric layer and at least a part of the second electrode are disposed between the first support layer and the second support layer, wherein a thickness of the second support layer is smaller than a thickness of the first support layer.

* * * * *